United States Patent [19]

Celler et al.

[11] 4,258,078
[45] Mar. 24, 1981

[54] METALLIZATION FOR INTEGRATED CIRCUITS

[75] Inventors: George K. Celler, Summit; Thomas E. Seidel, Berkeley Heights, both of N.J.

[73] Assignee: Bell Telephone Laboratories, Incorporated, Murray Hill, N.J.

[21] Appl. No.: 105,918

[22] Filed: Dec. 21, 1979

Related U.S. Application Data

[63] Continuation-in-part of Ser. No. 917,841, Jun. 22, 1978, abandoned.

[51] Int. Cl.³ .............................................. B05D 3/06
[52] U.S. Cl. ................................... 427/43.1; 29/847; 427/53.1; 427/89; 427/96; 219/121 LF; 219/121 LM
[58] Field of Search .................. 427/35, 53.1, 43.1, 427/86, 88, 89, 96, 376.1, 376.2, 376.7; 250/492 A, 492 B; 219/121 LE, 121 LF, 121 LG, 121 LM; 29/625

[56] References Cited

U.S. PATENT DOCUMENTS

| | | | |
|---|---|---|---|
| 3,838,288 | 9/1974 | Stolz | 250/492 B |
| 3,909,583 | 9/1975 | Petro | 219/121 L |
| 4,000,334 | 12/1976 | Hallman | 427/43.1 |
| 4,082,958 | 4/1978 | Kirkpatrick | 250/492 |
| 4,117,177 | 9/1978 | Schlater | 427/53.1 |
| 4,159,686 | 7/1979 | Heim | 219/121 LF |

*Primary Examiner*—John H. Newsome
*Attorney, Agent, or Firm*—Peter V. D. Wilde

[57] ABSTRACT

The sharp features that appear on metallization patterns defined by conventional etching processes can be eliminated by instantaneous melting with short laser pulses. Flow is minimized due to the brevity of the lifetime of the molten state but surface tension removes the sharp corners. With polysilicon metallization conductivity is also improved.

13 Claims, 4 Drawing Figures

METALLIZATION FOR INTEGRATED CIRCUITS

CROSS REFERENCE TO RELATED APPLICATION

This application is a continuation-in-part of my co-pending application, Ser. No. 917,841, filed June 22, 1978 now abandoned.

BACKGROUND OF THE INVENTION

Defects in integrated circuits are traced often to electrical shorts in metallization. A common metallization fault occurs between first and second metallization levels and is attributable to the sharp step on conductor rails of the first level over which a portion of the second level traverses. Various techniques for tapering the edges of the first level metallization have been proposed. Several of these depend on developing a faster etch rate at the surface of the first level metal layer than at the bottom. This can be achieved by varying the composition of the layer as it is deposited, or by damaging the surface of the layer after it has been deposited. As the layer is etched to define the metallization pattern, etching proceeds laterally at the surface at an enhanced rate and the final profile at the edge of the masked portion is tapered or curved. The insulating layer that is then deposited follows the curved topology, so the second level metal, where it crosses the first, sees a gradual rather than abrupt step.

According to this invention a simpler and more direct method is used to obtain a rounded corner on first level metallization. It is based on the recognition that metals used for metallization can be melted and quenched in a period so short that surface tension acts on the shape of the metal, but flow does not occur. The result is that the metallization pattern remains intact but the upper corners or other sharp features of the pattern are rounded.

Techniques superficially similar to this have been applied to glass articles for centuries. However, these are known to rely on the fact that glass does not have a sharp melting transition, and the rounded effects are regarded as due to slight flow of the glass. Surface tension is incidental.

It has also been found that the conductivity of polysilicon metallization can be increased by the technique of the invention.

DETAILED DESCRIPTION

Figure 1:
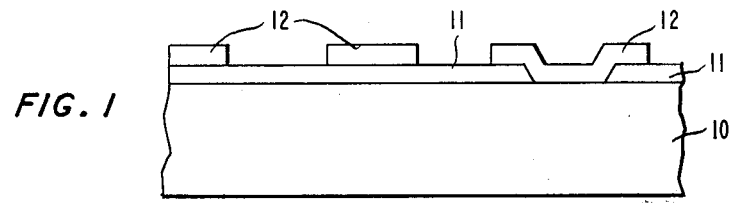
FIG. 1 is a sectional view of a portion of an integrated circuit prior to treatment according to the invention.
Figure 2:
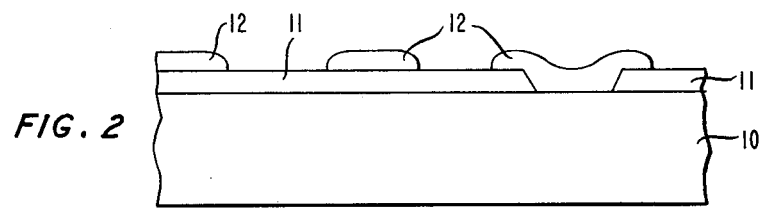
FIG. 2 is a view corresponding to FIG. 1 showing the same circuit after treatment according to the invention.

A portion of an integrated circuit is shown in FIGS. 1 and 2. The semiconductor substrate 10 is shown covered with the conventional insulating layer 11 and first level metallization 12. After etching the first level metal to define the pattern the corners of the conductor rails 12 resemble those in the figure. After treatment according to the invention the corners rounded as shown.

The treatment is essentially an instantaneous melting of the metal and is achieved conveniently by exposure to a short approximately 100 ns, high energy laser pulse. We have found experimentally that the proper combination of laser power and pulse duration is capable of causing a melting transition in which the lifetime of the molten state is so short (approximately $10^{-6}$ sec) that appreciable flow does not occur but surface tension is effected sufficient to remove the sharp features in the shape of the metal.

This invention may be used to improve the topology of conductors in a variety of shapes, configuration, patterns, and compositions. The technique is particularly attractive as applied to refractory metallization such as polysilicon, molybdenum, tungsten, etc., in which case melting by convention means, even if if could be controlled to avoid flow, would result in thermal damage to the device.

In a preferred embodiment of the invention the technique is applied to polysilicon. We have observed that the sheet resistivity of polysilicon treated according to the invention is improved (reduced). We attribute this to a change in the morphology of the polysilicon, most likely an increase in the crystal grain size. We would expect a similar effect in other refractory metal metallization.

Figure 3:
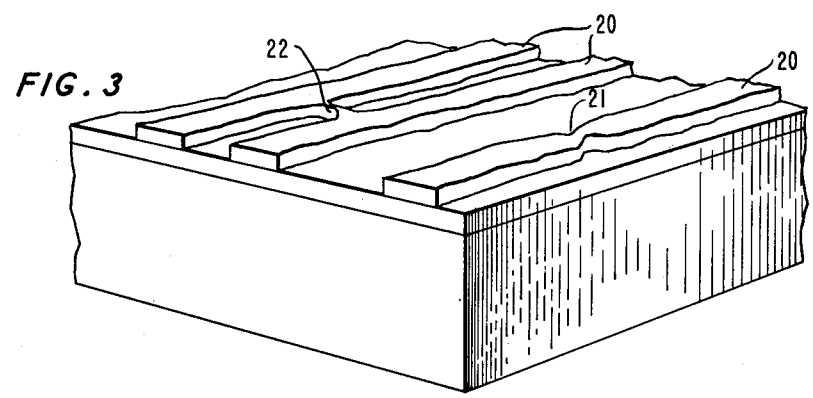
FIG. 3 is a perspective view showing a portion of an integrated circuit with a latent defect.
Figure 4:
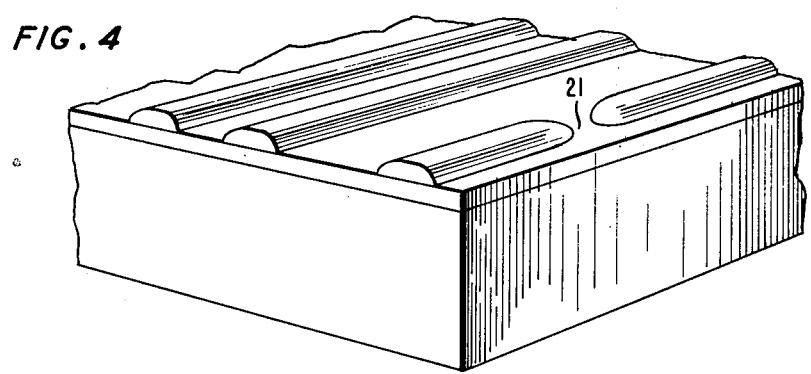
FIG. 4 is the same view as FIG. 3 after treatment according to the invention.

Another useful effect flowing from the operation of surface tension is illustrated in FIGS. 3 and 4. The conductive runners 20 are shown in a fashion more representative of the actual geometry produced, on a microdimensional scale by chemically etching a metal layer. A latent defect is shown at 21 which is a nearly open point in the conductor. Such defects often are not revealed by initial testing of the integrated circuit but appear soon after. These are often termed "infant mortality" defects. When the conductor is exposed to the treatment of the invention the conductor will open, as shown in FIG. 4, due to the effect of surface tension, and the defect will be revealed immediately during the initial electrical testing. A defect that can be cured by the treatment of the invention is shown at 22 in FIG. 3. This is a filamentary short between contiguous conductors. On instantaneous melting, these filaments are broken due to surface tension, and the electrical short is eliminated.

EXAMPLE

NMOS transistors were exposed to short pulses of laser radiation incident on the metallization. The devices were formed in a p-type silicon tub in a silicon wafer, using phosphorus implanted source and drain regions and a polysilicon gate. The gate oxide was 1k Angstroms and the polysilicon approximately 5k Angstroms and doped with phosphorus to approximately 15 ohms per square. The metallization was formed in a conventional way, that is, by applying a uniform coating of conductive material, in this case polysilicon, over a substantial portion of the wafer, lithographically masking the wafer over the desired interconnections and gate leaving the unwanted portions unmasked and then removing those portions to form the metallization pattern. The polysilicon layer can be formed by various techniques such as evaporation or sputtering. The lithographic masking may also be conventional using standard photolithographic or electron beam lithographic techniques. The etching step is also conventional using wet chemistry, plasma processes, or other suitable method. The etching step produces typically a structure with rough and irregular sidewalls as indicated schematically in FIG. 3. These sidewalls are characteristically steep and may even be re-entrant.

Overlapping laser pulses from a Nd:YAG laser were applied to several samples at different power levels ranging from 22 MW/cm$^2$ to approximately 70 MW/cm$^2$. Pulse duration was $10^{-7}$ sec. At the higher power levels the silicon was melted too severely resulting in open circuits. At lower power levels, 22–29 MW/cm$^2$, the corners of the polysilicon were rounded as represented in FIG. 2. Measurements of sheet conductance showed an improvement of 10 percent for the 22 MW/cm$^2$ exposure and 50 percent for the 29 MW/cm$^2$.

Duration of the molten state is typically of the order of $10^{-5}$ to $10^{-7}$ sec in order to achieve the goals of the invention. Using laser power levels of the kind described here, laser pulse duration of less than $10^{-5}$ and more typically, less than $5 \times 10^{-7}$, will produce the desired short-life melting. Results similar to these can be achieved using multiple pulses, and with different combinations of pulse duration, power and spot overlap. In fact, improvements in sheet conductivity of polysilicon metallization and MOS gates can be achieved without the added benefit of rounding the corners of the metal. For devices that do not require second level metal or crossover connections, it would be expected that the treatment could advantageously be designed to achieve only the single goal.

In the latter case, it is evident that the step of exposing the metallization to the melting radiation can be effected through an overlying layer if that expedient becomes convenient. In one case where that could prove convenient, the lithographic step used to define the metallization involves the growth or deposition of a masking layer, typically of an insulating material such as silicon dioxide, over the conductive layer, and patterning the masking layer, then patterning the conductive layer. This is a well known alternative to the use of a photoresist layer directly masking technique, but the use of an oxide masking layer, for example, suggests the step of exposing the metallization pattern to the melting radiation with the layer in place. This follows from the well known fact that silicon oxide, as well as other materials useful for the masking layer, or any such materials that are used for an intermediate dielectric layer where a process favors having that in place at the point in the processing sequence when the shaping step is conducted, is transparent to most laser radiation. We have found that this procedure does give the results that would be expected in light of the earlier description. Upon melting of the metallization, the oxide layer tends to assume the configuration of the melt-shaped metallization, and thereby attains the prescribed goal.

Another case where melting the conductive material via radiation through an overlying layer would be convenient is when the aforementioned improvement in metallization conductivity is achieved by laser melting of the metallization in a partly completed or completed device. In this case, the metallization is already covered with, typically, an insulating layer.

The treatment of this invention can be effected also using electron beam radiation. Similar relationships between the electron beam pulse and power to those described above prevail. For more detailed treatment of the use of electron beam processing of semiconductors, see U.S. Pat. No. 4,082,958, issued Apr. 4, 1978.

Various additional modifications and extensions of this invention will become apparent to those skilled in the art. All such variations and deviations which basically rely on the teachings through which this invention has advanced the art are properly considered to be withing the spirit and scope of this invention.

We claim:

1. A method for making integrated circuits comprising: forming at least portions of a multiplicity of devices in a semiconductor wafer, forming conductive interconnections between two or more devices by the steps of: applying a uniform coating of conductive material over a substantial portion of the wafer, lithographically masking the wafer over the desired interconnections leaving unwanting portions unmasked, and removing the unwanted portions to form a metallization pattern, the improvement comprising the further step of shaping the edges and/or corners of the metallization pattern by exposing them to laser or electron beam radiation, of sufficient power to melt the conductive material at said edges and/or corners for a period of time, said period of time being short enough to avoid substantial flow of the conductive material.

2. The method of claim 1 in which the conductive material is a metal.

3. The method of claim 2 in which the conductive material is polysilicon.

4. The method of claim 1 in which the substrate comprises silicon.

5. The method of claim 1 including the further step of forming a second level of metallization over the metallization shaped by melting.

6. The method of claim 1 in which the step of melting the conductive material increases the sheet conductivity of the material.

7. A method for making integrated circuits comprising: forming at least potions of a multiplicity of devices in a semiconductor wafer, forming conductive interconnections between two or more of the devices by the steps of: applying a uniform coating of conductive material over a substantial portion of the wafer, lithographically masking the wafer over the desired interconnections leaving unwanted portions unmasked, and removing the unwanted portions to form a metallization pattern, the invention characterized by the further step of exposing the conductive material to radiation from an electron beam or laser at a power level and for a time sufficient to increase the sheet conductivity of the conductive material by a least 10 percent.

8. The method of claim 7 in which the conductive material is polysilicon.

9. The method of claim 3 in which the pulse is a laser pulse with a duration of less than 0.5 microsec.

10. The method of claim 9 in which the laser pulse is produced by a Nd:YAG laser.

11. The method of claim 1 in which the lifetime of the molten condition is less than 10 microsec.

12. The method of claim 1 in which the laser or electron beam is pulsed.

13. The method of claim 1 wherein the metallization pattern is covered with an insulating layer or a masking layer while being exposed to the laser or electron beam radiation.

* * * * *

UNITED STATES PATENT AND TRADEMARK OFFICE
CERTIFICATE OF CORRECTION

PATENT NO. : 4,258,078

DATED : March 24, 1981

INVENTOR(S) : George K. Celler and Thomas E. Seidel

It is certified that error appears in the above—identified patent and that said Letters Patent is hereby corrected as shown below:

Column 4, line 6, "withing" should read --within--; line 15, "unwanting" should read --unwanted--.

Signed and Sealed this

Eleventh Day of August 1981

[SEAL]

Attest:

GERALD J. MOSSINGHOFF

Attesting Officer  Commissioner of Patents and Trademarks